(12) United States Patent
Rudolph

(10) Patent No.: US 10,407,769 B2
(45) Date of Patent: Sep. 10, 2019

(54) METHOD AND APPARATUS FOR DECREASING THE RADIAL TEMPERATURE GRADIENT IN CVI/CVD FURNACES

(71) Applicant: Goodrich Corporation, Charlotte, NC (US)

(72) Inventor: James W. Rudolph, Colorado Springs, CO (US)

(73) Assignee: GOODRICH CORPORATION, Charlotte, NC (US)

( * ) Notice: Subject to any disclaimer, the term of this patent is extended or adjusted under 35 U.S.C. 154(b) by 0 days.

(21) Appl. No.: 15/074,431

(22) Filed: Mar. 18, 2016

(65) Prior Publication Data
US 2017/0268101 A1 Sep. 21, 2017

(51) Int. Cl.
*C23C 16/04* (2006.01)
*C23C 16/458* (2006.01)
(Continued)

(52) U.S. Cl.
CPC .......... *C23C 16/045* (2013.01); *C23C 16/458* (2013.01); *C23C 16/4583* (2013.01); *C23C 16/46* (2013.01); *C23C 16/52* (2013.01)

(58) Field of Classification Search
CPC ..... C23C 16/045; C23C 16/46; C23C 16/458; C23C 16/45591; C23C 16/26;
(Continued)

(56) References Cited

U.S. PATENT DOCUMENTS 1,863,995 A * 6/1932 Ponstingl ............. A63H 33/082
403/295
2,868,712 A * 1/1959 Deprez ................... C25B 11/02
204/225
(Continued)

FOREIGN PATENT DOCUMENTS

CN 102455122 A * 5/2012 ............. F27B 21/00
WO 2003043068 5/2003
(Continued)

OTHER PUBLICATIONS

Steve Winters. "CFC Heat-Treating Racks for Materials for Ultra-high Temperatures." Industrial Heating. Dec. 2012. pp. 57-58.*
(Continued)

*Primary Examiner* — Jeffrie R Lund
*Assistant Examiner* — Stanislav Antolin
(74) *Attorney, Agent, or Firm* — Snell & Wilmer, L.L.P.

(57) ABSTRACT

A method and apparatus for decreasing the radial temperature gradient in CVI/CVD furnaces is provided. The apparatus may comprise a graphite susceptor disposed within a vessel. Porous structures may be stacked within the graphite susceptor. The stack of porous structures may form a circular shape proximate a radially inward surface of the graphite susceptor. Graphite panels may be disposed within the graphite susceptor. The graphite panels may be located proximate a radially inward surface of the porous structures. The graphite panels may radiate heat radially outward and towards the graphite susceptor. Reactant gas may be flowed into the graphite susceptor.

13 Claims, 4 Drawing Sheets

(51) Int. Cl.
*C23C 16/46* (2006.01)
*C23C 16/52* (2006.01)

(58) Field of Classification Search
CPC .......... C23C 16/45589; C23C 16/4583; C23C 16/4587; C04B 35/83; C04B 2235/614; C04B 2235/608; C04B 35/521; C04B 41/5001; C04B 2237/385; C04B 35/52; C04B 35/522; C04B 41/4556; F16D 69/023; F16D 65/12; C30B 25/165; C30B 31/14
See application file for complete search history.

(56) References Cited

U.S. PATENT DOCUMENTS

| | | | | |
|---|---|---|---|---|
| 3,261,625 A | * | 7/1966 | Cripe | E04B 2/764 403/173 |
| 3,370,389 A | * | 2/1968 | MacAluso | E04B 2/7435 52/239 |
| 3,451,183 A | * | 6/1969 | Lespagnol | E04B 2/766 403/230 |
| 3,513,606 A | * | 5/1970 | Jones | A47B 47/0016 211/182 |
| 3,549,847 A | * | 12/1970 | Brown | C04B 35/52 118/725 |
| 3,566,561 A | * | 3/1971 | Tozer | A47B 96/1466 52/127.12 |
| 4,062,318 A | * | 12/1977 | Ban | C23C 16/45506 118/500 |
| 4,560,130 A | * | 12/1985 | Schwartz | F16B 12/32 248/297.21 |
| 5,348,774 A | * | 9/1994 | Golecki | C04B 35/521 177/245 |
| 5,350,003 A | * | 9/1994 | Sonuparlak | B22D 19/14 164/69.1 |
| 5,480,678 A | * | 1/1996 | Rudolph | C04B 35/83 118/715 |
| 5,647,181 A | * | 7/1997 | Hunts | A63H 33/10 312/111 |
| 5,674,320 A | * | 10/1997 | Kordina | C23C 16/4583 118/500 |
| 5,695,567 A | * | 12/1997 | Kordina | C30B 25/12 118/725 |
| 5,808,282 A | * | 9/1998 | Apte | C04B 35/117 219/679 |
| 5,864,997 A | * | 2/1999 | Kelly | A01G 9/14 52/282.2 |
| 5,879,462 A | * | 3/1999 | Kordina | C30B 23/02 117/951 |
| 6,025,575 A | | 2/2000 | Park et al. | |
| 6,177,146 B1 | * | 1/2001 | Fisher | C04B 35/83 427/249.2 |
| 6,402,836 B1 | * | 6/2002 | Leycuras | C30B 11/00 117/54 |
| 6,512,216 B2 | * | 1/2003 | Gedevanishvili | B22F 3/105 219/756 |
| 6,669,988 B2 | * | 12/2003 | Daws | C23C 16/045 427/249.2 |
| 6,709,520 B1 | * | 3/2004 | Leycuras | C30B 11/00 118/715 |
| 6,780,462 B2 | | 8/2004 | Purdy et al. | |
| 6,818,085 B2 | * | 11/2004 | Behr | C04B 35/573 156/89.26 |
| 7,332,195 B2 | | 2/2008 | Arico et al. | |
| 7,959,973 B2 | | 6/2011 | Waghray et al. | |
| 8,133,532 B2 | | 3/2012 | Messier-Bugatti-Dowty | |
| 8,431,878 B2 | * | 4/2013 | Dunn | H05B 6/78 219/700 |
| 2001/0019752 A1 | * | 9/2001 | Purdy | C04B 35/83 428/64.1 |
| 2003/0035893 A1 | * | 2/2003 | Daws | C23C 16/045 427/255.28 |
| 2003/0079689 A1 | * | 5/2003 | Sumakeris | C23C 16/4581 118/725 |
| 2003/0089481 A1 | * | 5/2003 | Moore | F27B 14/06 164/250.1 |
| 2003/0089674 A1 | * | 5/2003 | Gassier | E04B 2/766 211/189 |
| 2003/0209537 A1 | * | 11/2003 | Dalton | B01D 53/32 219/634 |
| 2004/0074204 A1 | * | 4/2004 | McKinnon | A47B 47/03 52/781 |
| 2004/0237898 A1 | * | 12/2004 | Bernard | C04B 35/83 118/724 |
| 2004/0238794 A1 | * | 12/2004 | Karandikar | B01J 19/126 252/500 |
| 2005/0181627 A1 | * | 8/2005 | Kamata | C30B 25/02 438/778 |
| 2006/0016805 A1 | * | 1/2006 | Del Regno | H05B 6/80 219/680 |
| 2006/0046059 A1 | * | 3/2006 | Arico | C23C 16/045 428/408 |
| 2006/0068679 A1 | * | 3/2006 | Bewlay | H01J 9/266 445/26 |
| 2006/0081187 A1 | * | 4/2006 | Maccalli | C23C 16/46 118/725 |
| 2006/0126700 A1 | * | 6/2006 | Wilcox | F27B 14/061 373/151 |
| 2006/0199132 A1 | * | 9/2006 | Scheibel | C21D 9/0025 432/120 |
| 2006/0201936 A1 | * | 9/2006 | Agrawal | B01J 19/126 219/679 |
| 2006/0269665 A1 | * | 11/2006 | Rudolph | C04B 35/83 427/248.1 |
| 2007/0014990 A1 | * | 1/2007 | Arico | C04B 35/83 428/408 |
| 2007/0114687 A1 | * | 5/2007 | Simpson | C04B 35/6267 264/29.1 |
| 2007/0125769 A1 | * | 6/2007 | Tenzek | C21D 11/00 219/634 |
| 2007/0227783 A1 | * | 10/2007 | Rudolph | C23C 16/045 177/245 |
| 2007/0278003 A1 | * | 12/2007 | Matviya | H05K 9/0086 174/354 |
| 2008/0052901 A1 | * | 3/2008 | Nishikawa | H01L 21/67103 29/829 |
| 2008/0124462 A1 | * | 5/2008 | Waghray | C04B 35/83 427/249.2 |
| 2008/0127894 A1 | * | 6/2008 | Sumakeris | C23C 16/4581 118/725 |
| 2008/0152803 A1 | * | 6/2008 | Lamouroux | C23C 16/045 427/248.1 |
| 2008/0190357 A1 | * | 8/2008 | Karlsson | C23C 16/4584 117/200 |
| 2008/0290771 A1 | * | 11/2008 | Jimenez | A47B 47/0083 312/263 |
| 2010/0092697 A1 | * | 4/2010 | Poppe | C23C 16/45502 427/585 |
| 2010/0092698 A1 | * | 4/2010 | Poppe | C23C 16/4408 427/585 |
| 2010/0163550 A1 | * | 7/2010 | Belsh | F27B 14/061 219/634 |
| 2010/0221427 A1 | * | 9/2010 | Fry | C23C 16/045 427/255.28 |
| 2011/0143521 A1 | * | 6/2011 | Zuniga | H01L 21/67766 438/458 |
| 2011/0244267 A1 | * | 10/2011 | Takeda | C04B 41/009 428/623 |
| 2011/0277690 A1 | * | 11/2011 | Rozenzon | C23C 16/45561 118/723 MW |
| 2012/0085752 A1 | * | 4/2012 | Rinaldi | H05B 6/129 219/634 |
| 2012/0112034 A1 | * | 5/2012 | Harris | A47F 5/105 248/535 |
| 2012/0153298 A1 | * | 6/2012 | Kordina | H01L 21/67109 257/77 |
| 2013/0243955 A1 | * | 9/2013 | Carlisle | C23C 16/448 427/248.1 |

(56) References Cited

U.S. PATENT DOCUMENTS

| | | | | |
|---|---|---|---|---|
| 2013/0264335 A1* | 10/2013 | Uchida | ............... | H05B 6/36 219/634 |
| 2015/0204199 A1* | 7/2015 | Schonfeld | ............ | F04D 29/023 416/241 R |
| 2015/0204364 A1* | 7/2015 | Schonfeld | ............ | C04B 37/005 403/267 |
| 2015/0204375 A1* | 7/2015 | Schonfeld | ............ | F16B 5/0241 411/204 |

FOREIGN PATENT DOCUMENTS

| | | | | |
|---|---|---|---|---|
| WO | 03060183 | | 7/2003 | |
| WO | WO 2014026821 A1 * | 2/2014 | ............ | C04B 37/005 |
| WO | WO 2014026822 A1 * | 2/2014 | ............ | F16B 5/0241 |
| WO | WO 2014026994 A2 * | 2/2014 | ............ | F04D 29/023 |

OTHER PUBLICATIONS

"CFC und Graphit fuer Hochtemperaturanwendungen." Brochure 2013. pp. 1-20. GTD Graphit Technologie GmbH. http://www.gtd-graphit.de (accessed: Jun. 13, 2017).*

"C/C and Graphite for High-Temperature Applications." Brochure Apr. 2015. pp. 1-20. GTD Graphit Technologie GmbH. http://www.gtd-graphit.de (accessed: Jun. 13, 2017).*

"Graphitloesungen fuer Hochtemperaturanwendungen. [Carbon solutions for high temperature applications.]" Brochure 2013. pp. 1-16. CP-Graphitprodukte GmbH. http://www.graphithandel.de (accessed: Jun. 13, 2017).*

Rob Kornfeld. "Vacuum Furnaces: Maximizing the Work Zone with Creative Fixturing." Industrial Heating. Mar. 2013. pp. 59-60.*

Schunk Carbon Technology Advertisement: "Carbon/Carbon Fixtures." Industrial Heating. Sep. 2013. p. 88.*

Bill Warwick et al. "Technical Considerations for the Use of Carbon/Carbon Composite Materials for Fixtures and Grids." Industrial Heating. Dec. 2013. pp. 47-51.*

"Heat Treatment Customized Solutions for Your Heat Treatment Needs." Brochure Jun. 2015. pp. 1-16. Schunk Carbon Technology. http://www.schunk-carbontechnology.com (accessed: Jun. 13, 2017).*

"Heat Treatment Customized Solutions for Your Heat Treatment Needs." Brochure Jun. 2015. pp. 1-23. Schunk Carbon Technology. http://www.schunk-carbontechnology.com (accessed: Jun. 13, 2017) (HTCustomized'2015). (Year: 2015).*

"Industrial Profile Systems: High-Strength Aluminum Framing and Components." 2011. Catalog 1816-3/US. pp. 1-18. Parker Hannifin Corporation. http://www.parkermotion.com/products/IPS_T_Slot_Aluminum_Framing_7247_30_32_80_567_29.html (accessed: Jan. 21, 2019). (IPS_Cat'1816-3). (Year: 2011).*

EP Search Report dated Sep. 14, 2017 in U.S. Appl. No. 17/161,291. 4.

* cited by examiner

METHOD AND APPARATUS FOR DECREASING THE RADIAL TEMPERATURE GRADIENT IN CVI/CVD FURNACES

FIELD

The present disclosure relates to chemical vapor infiltration and deposition processes ("CVI/CVD"), and more specifically, to a method and apparatus for decreasing the radial temperature gradient in CVI/CVD furnaces.

BACKGROUND

Chemical vapor infiltration and deposition (CVI/CVD) is a known process for making composite structures such as carbon/carbon brake disks. The CVI/CVD process typically used for making carbon/carbon brake disks is sometimes referred to as "conventional" or "isothermal" CVI/CVD. This process involves passing a reactant gas or gas mixture around heated stack of porous structures (e.g., a carbonized stack of porous structures) at absolute pressures as low as a few torr (~400 Pa or less). The gas diffuses into the stack of porous materials, driven by concentration gradients, and undergoes a CVD reaction such as thermal decomposition, hydrogen reduction, co-reduction, oxidation, carbidization, or nitridation to deposit a binding matrix.

Depending on CVI/CVD methodology and conditions, the porous structure may not densify at a uniform rate across the thickness of a porous structure, may not form a desired microstructure and/or may be associated with long processing times. Thus, creation of uniformly densified porous structures may be impaired using conventional systems and methods.

SUMMARY

In various embodiments, an apparatus for densifying an annular porous structure is disclosed. The apparatus may comprise a vessel. A graphite susceptor may be disposed within the vessel. The graphite susceptor may be configured to receive a reactant gas flow. The apparatus may comprise a graphite panel disposed within the graphite susceptor and located radially inward from the graphite susceptor.

In various embodiments, the graphite panel may comprise a void configured to allow passage of the reactant gas flow. The graphite panel may be 0.50 inches thick. The apparatus may further comprise a preheater configured to heat the reactant gas flow to a defined temperature before flowing into the graphite susceptor. The apparatus may comprise a porous structure stack disposed within the graphite susceptor. The porous structure stack may comprise the annular porous structure. The annular porous structure may comprise a carbon fiber. The graphite panel may be configured to radiate heat radially outward towards the porous structure stacks.

In various embodiments, a method of densifying an annular porous structure is disclosed. The method may comprise stacking a plurality of annular porous structures to form a porous structure stack in a graphite susceptor. The graphite susceptor may be disposed within a vessel. The method may comprise disposing a graphite panel within the graphite susceptor in a location radially inward from the porous structure stack. The method may comprise flowing a reactant gas into the graphite susceptor.

In various embodiments, the method may further comprise flowing the reactant gas through the graphite panel. The reactant gas may flow through the graphite panel. The graphite panel may comprise a void configured to allow passage of the reactant gas. The graphite panel may be 0.50 inches thick. The method may further comprise heating, by a preheater, the reactant gas to a defined temperature prior to flowing the reactant gas into the graphite susceptor. The reactant gas may comprise at least one of methane, ethane, propane, cyclopentane, hydrogen, nitrogen, helium, argon, or an alkane. The plurality of annular porous structures may comprise a carbon fiber. The method may also comprise radiating heat, by the graphite panel, radially outward towards the plurality of annular porous structures.

In various embodiments, an apparatus for densifying an annular porous structure is disclosed. The apparatus may comprise a vessel, and a graphite susceptor disposed within the vessel. The graphite susceptor may be configured to radiate heat energy radially inward from the vessel. The graphite susceptor may be configured to receive a reactant gas. The apparatus may comprise a hardware assembly disposed within the graphite susceptor. The hardware assembly may comprise a graphite support plate coupled to a graphite support post. The apparatus may comprise at least one graphite panel coupled to the graphite support post. The at least one graphite panel may be configured to radiate heat radially outward towards the graphite susceptor.

In various embodiments, the at least one graphite panel may comprise at least one void configured to allow passage of the reactant gas. The at least one graphite panel may be 0.50 inches thick. The apparatus may further comprise a preheater configured to heat the reactant gas to a defined temperature before flowing into the graphite susceptor. The reactant gas may comprise at least one of methane, ethane, propane, cyclopentane, hydrogen, nitrogen, helium, argon, or an alkane. The apparatus may further comprise a porous structure stack disposed within the hardware assembly and located radially outward from the graphite panel. The porous structure stack may comprise the annular porous structure.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the following illustrative figures. In the following figures, like reference numbers refer to similar elements and steps throughout the figures.

Figure 1:
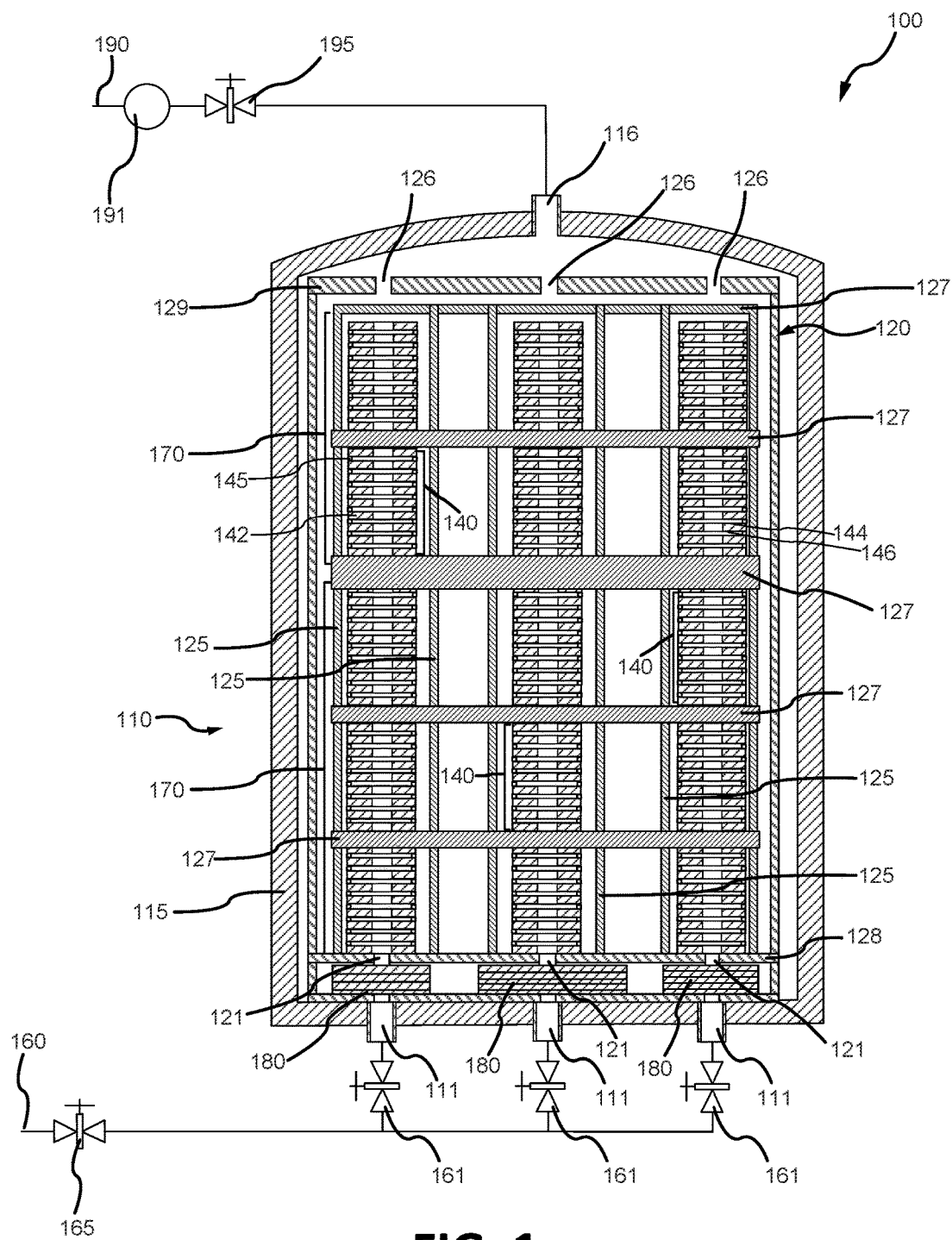
FIG. 1 illustrates a schematic front view of a CVI/CVD apparatus, in accordance with various embodiments.

Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosures, it should be understood that other embodiments may be realized and that logical changes and adaptations in design and construction may be made in accordance with this disclosure and the teachings herein. Thus, the detailed description herein is presented for purposes of illustration only and not of limitation.

The scope of the disclosure is defined by the appended claims and their legal equivalents rather than by merely the examples described. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, coupled, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts but not necessarily to denote the same or different materials.

Carbon/carbon parts ("C/C") in the form of friction disks (also referred to as a carbon/carbon brake disks) are commonly used for aircraft brake disks, race car brakes, and clutch disks. Carbon/carbon brake disks are especially useful in these applications because of the superior high temperature characteristics of C/C material. In particular, the carbon/carbon material used in C/C parts is a good conductor of heat and is able to dissipate heat generated during braking away from the braking surfaces. Carbon/carbon material is also highly resistant to heat damage, and thus, is capable of sustaining friction between brake surfaces during severe braking without a significant reduction in the friction coefficient or mechanical failure. Furthermore, carbon/carbon brake disks are useful because they are relatively light weight, in particular in comparison to previous steel brakes.

One method of manufacturing C/C materials involves fabrication of a preform from an oxidized polyacrylonitrile (PAN) (also referred to as "OPF") or carbon fiber, followed by carbonization and chemical vapor infiltration (CVI) densification of the preform. As used herein, a preform may comprise any porous structure, and the terms preform, fibrous preform, and porous structure may be used interchangeably. The CVI/CVD process cycles are continued, in conjunction with machining the preform between infiltration cycles if desired, until the desired part density is achieved. In various embodiments, machining the surfaces of the preform may open surface porosity, thereby facilitating weight increases (i.e., density increases) in the preform during subsequent densification steps.

In general, C/C parts produced using the OPF, carbonization, and CVI/CVD densification method are made in three successive manufacturing steps. First, a preform is made utilizing a variety of textile manufacturing techniques. Typically, the preform is made from OPF or carbon fiber. Although numerous techniques are known in the art for making preforms from OPF, a common technique involves stacking layers of OPF to superimpose the layers. The added layers may then be needled perpendicularly to the layers with barbed textile needles. The needling process generates a series of z-fibers through the preform that extend perpendicularly to the fibrous layers. The z-fibers are generated through the action of the needles pushing fibers from within the layer (x-y or in-plane) and reorienting them in the z-direction (through-thickness). Needling of the preform may be done as one or more layers are added to the stack or may be done after the entire stack is formed. The needles may also penetrate through only a portion of the preform or may penetrate through the entire preform. In addition, resins are sometimes added to the preform by either injecting the resin into the preform following construction or coating the fibers or layers prior to forming the preform. Preforms may also be made from pitch based carbon fiber tows and/or from rayon carbon fiber tows.

After the preform is made, it is carbonized to convert the OPF into carbon fibers in a process referred to herein as carbonization/graphitization. Typically, preforms are carbonized by placing the preforms in a furnace with an inert atmosphere. As is well-understood by those in the art, the heat of the furnace causes a chemical conversion which drives off the non-carbon chemicals from the preform. Carbonization/graphitization may be conducted in a vacuum or partial vacuum (e.g., at pressures of 1-15 torr) or in an inert atmosphere at a temperature in the range from about 1,400° C. to about 2,800° C. (2,552° F. to about 5,072° F.), and in various embodiments in the range from about 1,400° C. to about 2,500° C. (2,552° F. to about 4,532° F.), and in various embodiments in the range from about 1,400° C. to about 2,200° C. (2,552° F. to about 3,992° F.) (wherein the term about in this context only means +/−100° C.) for a period of time in the range of up to about 60 hours, and in various embodiments, in the range up to about 10 hours (wherein the term about in this context only means +/−2 hours). The resulting preform generally has the same fibrous structure as the preform before carbonizing. However, the OPF have been converted to 100% carbon or very near 100%, for example from 95% carbon to 99.9% carbon. The resulting preform may be referred to as having a fibrous network. In various embodiments, the preform may comprise any geometry.

After the preform has been carbonized, the preform is densified. The preform may be referred to as a "porous structure" before and during densification. In general, densification involves filling the voids, or pores, of the preform with additional carbon material. This may be done using the same furnace used for carbonization or a different furnace. Typically, chemical vapor infiltration and deposition ("CVI/CVD") techniques are used to densify the preform with a carbon matrix. This commonly involves heating the furnace and the preforms, and flowing a reactant gas comprising, for example, hydrocarbon gases (e.g., at least one of methane, ethane, propane, butane, and/or the like, as described herein) into the furnace and around and through the preforms. The hydrocarbons may comprise alkanes, for example, straight chain, branched chain and/or cyclic alkanes, having from 1 to about 8 carbon atoms, and in various embodiments from 1 to about 6 carbon atoms, and in various embodiments from 1 to about 3 carbon atoms. Methane, ethane, propane, cyclopentane, or mixtures of two or more thereof may be used. The reactant gas may comprise one or more alkanes of 2 to about 8 carbon atoms, and in various embodiments from 2 to about 6 carbon atoms. Mixtures of one or more alkanes of 1 to about 8 carbon atoms with one or more alkenes of 2 to about 8 carbon atoms may be used. In various embodiments, the CVI/CVD process may include a temperature gradient. In various embodiments, the CVI/CVD process may include a pressure differential. As used herein, CVI/CVD may refer to chemical vapor infiltration or chemical vapor deposition. Accordingly, CVI/CVD may refer to chemical vapor infiltration or deposition.

CVI/CVD densification may be conducted in a vacuum or partial vacuum (e.g., at pressures of 1-15 torr (133 Pa to 1999 Pa) or in an inert atmosphere at a temperature in the range from about 900° C. to about 1100° C. (1,652° F. to about 2012° F.), and in various embodiments in the range of up to about 1,000° C. (1,832° F.) (wherein the term about in this context only means +/−100° C.) for a period of time in the range from about 150 hours to about 550 hours, and in various embodiments, in the range from about 300 hours to about 700 hours (wherein the term about in this context only means +/−24 hours). The number of hours used in a CVI/CVD process may be referred to as hours on gas ("HOG").

As a result, carbon decomposes or pyrolyzes from the hydrocarbon reactant gases and is deposited on and within the preforms. Typically, the densification process is continued until the preform reaches a density in the range from 1.6 to 1.9 grams per cubic centimeter (g/cc), and in various embodiments, a density of approximately 1.75 g/cc. When the densification step is completed, the resulting C/C part has a carbon fiber structure with a carbon matrix infiltrating the fiber structure, thereby deriving the name "carbon/carbon."

The term "composite structure" may refer to a densified porous structure. The composite structure may comprise a porous structure with a solid residue or matrix dispersed within. The composite structure may comprise a carbonaceous porous structures with a carbonaceous matrix dispersed within. This may be referred to as a carbon/carbon composite. The composite structure may comprise a ceramic porous structure with a ceramic or oxide matrix dispersed within. The composite structure may comprise a mixed or hybrid composite structure such as a carbon porous structure with a ceramic or oxide matrix dispersed within, a carbon porous structure with a mix of carbon and ceramic or oxide matrix dispersed within, a ceramic porous structure with a carbon matrix dispersed within, a ceramic porous structure with a mix of carbon and ceramic or oxide matrix dispersed within, and/or the like. In various embodiments, the composite structure may comprise carbon, silicon, silicon carbide, silicon nitride, boron, boron carbide, aluminum nitride, titanium nitride, cubic zirconia, and $SiC_xN_y$, where x is a number in the range from about zero to about 1, and y is a number in the range from about zero to about 4/3. The composite structure may comprise a first surface, a second surface and at least one other surface connecting the first surface and the second surface. In various embodiments, and as used herein, any surface may comprise any suitable shape, such as, for example, at least one of rounded, sphere shaped, toroid shaped, or frustoconical.

The terms "higher order rough laminar structure," "rough laminar microstructure," "transitional microstructure," "smooth laminar microstructure," "transitional microstructure," "dark laminar" and "isotropic" may be used to describe the microstructure of a composite structure employing a carbon matrix dispersed in the porous materials. The microstructure may be determined by use of polarized light microscopy. A carbon/carbon composite with a rough laminar structure may be characterized as having high optical activity and numerous irregular extinction crosses. A carbon/carbon composite with a smooth laminar structure may be characterized as having low optical activity and smooth extinction crosses. A carbon/carbon composite with little to no optical activity may be characterized as dark laminar or isotropic. These microstructures may be quantified in terms of their extinction angles.

Composite structures made according to various embodiments may be useful as carbon/carbon aircraft disk brakes, ceramic combustion and turbine components such as turbine engine hot section components, ceramic friction materials, ceramic heat sinks, and the like. The carbon/carbon disk brakes may be in the form of circular disks or disks.

As used herein, the term "stack of porous structures" may be interchangeable with "porous structures stack." A porous structure stack may comprise any number of porous structures on top of one another. In this regard, the porous structures may be in contact with each other in the porous structure stack. The porous structure stack may also comprise porous structures stacked on top of one another, with spacers, and/or other hardware, separating each individual porous structure. In this regard, the porous structures may be stacked such that each porous structure is not in contact with another porous structure (i.e., the spacers are in contact with the porous structures).

In various embodiments, pressure differentials may also be used with thermal gradients. A pressure differential may be created when pressure on one surface of a stack of porous structures is different than the pressure at another surface of the stack of porous structures.

In conventional systems for CVI/CVD densification, soot and/or tar may coat surfaces of the stack of porous structures. Soot may refer to undesirable accumulations of carbon particles on the furnace equipment and/or stack of porous structures, and tar may refer to undesirable accumulations of large hydrocarbon molecules on the furnace equipment/stack of porous structures. The large hydrocarbon molecules may cause thick coatings on the surfaces of the stack of porous structures. Typically, accumulations of soot and/or tar form when the reactant gas stagnates for a period of time in an area or comes into contact with cooler furnace surfaces. Stagnation typically occurs in areas where the gas flow is blocked or where the gas flow is moving more slowly than the surrounding gas flow.

Accumulations of soot and tar can cause a number of problems which affect both the quality of the composite structures and the costs of manufacturing. Seal-coating is one typical problem that can result from soot and tar, although seal-coating can also be caused by other conditions that are described below. Seal-coating may occur when soot and/or tar deposit excess carbon early in the densification process on surfaces of the porous structures. As the carbon accumulates on the surfaces of the porous structures, the surface pores eventually become blocked (i.e., occluded), or sealed, thus preventing the flow of reactant gas from further permeating the stack of porous structures. As a result, densification of the interior region around the seal-coated surface prematurely stops, thereby potentially leaving interior porous defects in the finished carbon part (i.e., the densified preform).

To address the occlusion of pores in a porous structure, conventionally, multiple densification steps were employed. Stated another way, a CVI/CVD process would be stopped, the furnace allowed to cool, and the porous structure would be extracted and machined to open the pores. Then, the porous structure would be placed into the furnace and the CVI/CVD process would commence again in a second CVI/CVD process step. The rearrangement and machining of the porous structures between cycles (steps) is costly and time-consuming. Thus, in various embodiments, disclosed herein is a CVI/CVD process that may begin with a porous structure that has previously not undergone a CVI/CVD process and achieve a commercially viable density of that porous structure (e.g., reaches a density in the range from 1.6 g/cc to 1.9 g/cc), and in various embodiments, a density of approximately 1.75 g/cc) in a single cycle. In this regard, in various embodiments, a porous structure may be manufactured without use of multiple cycles.

Typically, CVI/CVD furnaces rely on a cylindrical graphite susceptor to radiate heat into the porous structures. The heat imparted to the porous structures is a function of the radial distances from the surface of the graphite susceptor wall. Thus, the temperature is the highest at the graphite susceptor wall surface and decreases as a function of the radial distance from the graphite susceptor wall, reaching a minimum value at the center of the CVI/CVD furnace (i.e., the farthest distance from the inner wall of the graphite susceptor). During the densification process, a temperature gradient results, with the side of the porous structure nearest a graphite susceptor wall at a higher temperature than the side of the porous structure farthest from a graphite susceptor wall. The lower temperature region densifies at a slower rate compared to the higher temperature region, resulting in a higher average density on one-half of the porous structure, and a lower average density on the other half of the porous structure.

In various embodiments, CVI/CVD processes are disclosed herein, wherein interior graphite panels may be implemented in a single processing cycle. Interior graphite panels may allow for a more even temperature gradient during a CVI/CVD process cycle, thereby allowing a commercially-viable density to be achieved in a single processing cycle.

In various embodiments, and with reference to FIG. 1, an apparatus 100 for densifying an annular porous structure is disclosed. Apparatus 100 may comprise a furnace 110, and various components to feed and exhaust reactive gas. A number of different types of furnaces 110 may be used for CVI/CVD processes. Typically, furnace 110 may include a vessel 115 that encloses a graphite susceptor 120. Graphite susceptor 120 may enclose one or more porous structure stacks 140 that are to undergo a CVI/CVD process.

In various embodiments, to provide for the flow of reactant gas and to facilitate discharge of reactant gas exhaust, vessel 115 of furnace 110 may comprise a number of inlet ducts and outlet ducts. The inlet ducts and outlet ducts may comprise a void in vessel 115, allowing the passage of reactant gas through vessel 115. In this regard, vessel 115 may comprise at least one inlet duct 111 and an outlet duct 116. Inlet ducts 111 may allow reactant gas to flow into furnace 110, through vessel 115. Outlet duct 116 may allow reactant gas to flow out furnace 110, through vessel 115.

In various embodiments, graphite susceptor 120 may be disposed within furnace 110 and may be induction heated by an induction coil or gas flame. Although induction heating is described herein, other methods of heating may also be used such as gas heating, resistance heating, microwave heating, and/or the like, any of which are considered to fall within the present disclosure. During a CVI/CVD process, graphite susceptor 120 may radiate heat radially inward. Graphite susceptor 120 may comprise a number of inlet openings and outlet openings to provide for the flow of reactant gas and to facilitate discharge of reactant gas exhaust. The inlet openings and outlet openings may comprise a void in graphite susceptor 120, allowing the passage of gas through graphite susceptor 120.

In that regard, graphite susceptor 120 may comprise at least one inlet opening 121 configured to allow reactant gas to flow into graphite susceptor 120. Inlet openings 121 may be located in a false graphite floor 128 of graphite susceptor 120, and may be in fluid communication with inlet ducts 111 such that reactant gas may flow through vessel 115 and into graphite susceptor 120. Graphite susceptor 120 may also comprise at least one outlet opening 126 configured to allow reactant gas to flow out of graphite susceptor 120. Outlet openings 126 may be located in a graphite lid 129 of graphite susceptor 120, and may be in fluid communication with outlet duct 116, such that reactant gas may flow through graphite susceptor 120 and exit through vessel 115.

In various embodiments, one or more porous structure stacks 140 may be enclosed within graphite susceptor 120. The porous structure stacks 140 may comprise a plurality of porous structures 142, spaced vertically in porous structure stacks 140 by a plurality of spacers 145. Spacers 145 may comprise carbon/carbon, graphite, and/or any other suitable material. Spacers 145 may also comprise a surface coating to prevent spacers 145 from adhering to porous structures 142. Spacers 145 may also comprise spacer rings. Porous structures 142 may comprise an annular shape. Porous structure 142 may comprise an axially top surface 144 and an axially bottom surface 146. Porous structure stacks 140 may be disposed within graphite susceptor 120. In this regard, porous structure stacks 140 may be predominantly heated from the radiated heat of graphite susceptor 120. Reactant gas may be introduced through inlet opening 121, and may pass through and/or around porous structure stacks 140. In this regard, the reactant gas may pass through spacers 145, and around axially top surface 144 and axially bottom surface 146 of porous structures 142.

In various embodiments, porous structure stacks 140 may be disposed within graphite susceptor 120 as part of a hardware assembly 170. Hardware assembly 170 may comprise a graphite support plate 127 and a graphite support post 125. Hardware assembly 170 may allow for an easier loading and unloading of porous structure stacks 140 into furnace 110. Graphite support plates 127 may support porous structure stacks 140 in furnace 110. Graphite support plates 127 may comprise voids allowing passage of reactant gas. Graphite support posts 125 may separate graphite support plates 127 and provide structural support for hardware assembly 170. Hardware assembly 170 may be disposed within graphite susceptor 120 and placed onto false graphite floor 128 of graphite susceptor 120. In various embodiments, hardware assembly 170 may be stacked onto a second hardware assembly 170, so as to create a second stack of porous structure stacks 140 in furnace 110.

In various embodiments, a reactant gas feed line 160 may be configured to facilitate flow of reactant gas from a reactant gas source into furnace 110. An inlet control valve 165 may be in fluid communication with reactant gas feed line 160 and may be configured to allow or restrict the flow of reactant gas into furnace 110. Inlet control valve 165 may also be in fluid communication with at least one inlet valve 161. Thus, actuation of inlet control valve 165 may operate to supply and restrict reactant gas to inlet valves 161. Inlet valves 161 may be in fluid communication with inlet ducts 111, and may be configured to control the flow of reactant gas into inlet ducts 111. In this regard, inlet valves 161 may enable the flow of reactant gas through inlet ducts 111 and inlet openings 121, and into graphite susceptor 120.

In various embodiments, a preheater 180 may be configured to heat the reactant gas before the reactant gas flows into graphite susceptor 120. For example, preheater 180 may comprise a series of graphite plates with voids, heated by an induction coil and/or graphite susceptor 120. In this regard, preheater 180 may heat the reactant gas to a defined temperature. The defined temperature may comprise a desired temperature of the reactant gas in furnace 110. Apparatus 100 may comprise a single preheater 180, configured to receive and heat reactant gas prior to the reactant gas flowing into graphite susceptor 120. Preheater 180 may be in fluid communication with inlet ducts 111 to receive reactant gas. Apparatus 100 may also comprise multiple preheaters 180, such that each inlet duct 111 may flow reactant gas into a separate preheater 180. Preheater 180 may receive reactant gas, heat the reactant gas to a specified temperature, and then flow the reactant gas into graphite susceptor 120. In this regard, preheater 180 may be fluidly sealed to prevent any reactant gas from leaking out of preheater 180. Preheater 180 may flow the reactant gas into graphite susceptor 120 through inlet openings 121 in false graphite floor 128.

In various embodiments, an exhaust line 190 may be configured to withdraw reactant gas from furnace 110. Exhaust line 190 may be in fluid communication with outlet duct 116. A vacuum pump 191 may be in fluid communication with exhaust line 190. Vacuum pump 191 may be configured to provide a suction source to evacuate furnace 110 through exhaust line 190.

In various embodiments, an exhaust control valve 195 may be in fluid communication with exhaust line 190 and may be configured to control the suction from vacuum pump 191 to furnace 110. Thus, actuation of exhaust control valve 195 may operate to supply and restrict suction to furnace 110. Exhaust control valve 195 may be in fluid communication with outlet duct 116, and may be configured to control the exhaust of reactant gas from furnace 110, via outlet duct 116. In this regard, exhaust control valve 195 may also control the evacuation of reactant gas from graphite susceptor 120, through outlet openings 126 and outlet duct 116.

Figure 2:
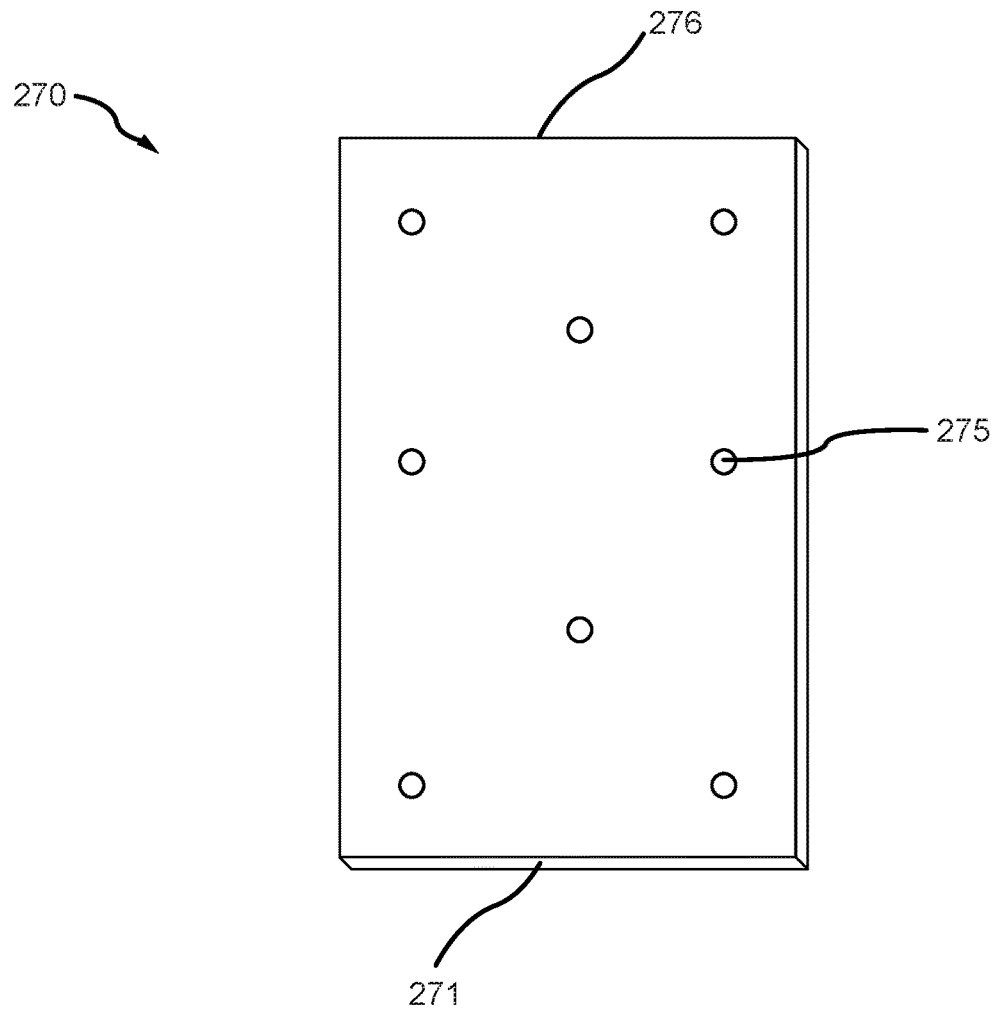
FIG. 2 illustrates a front perspective view of a graphite panel, in accordance with various embodiments.
Figure 3:
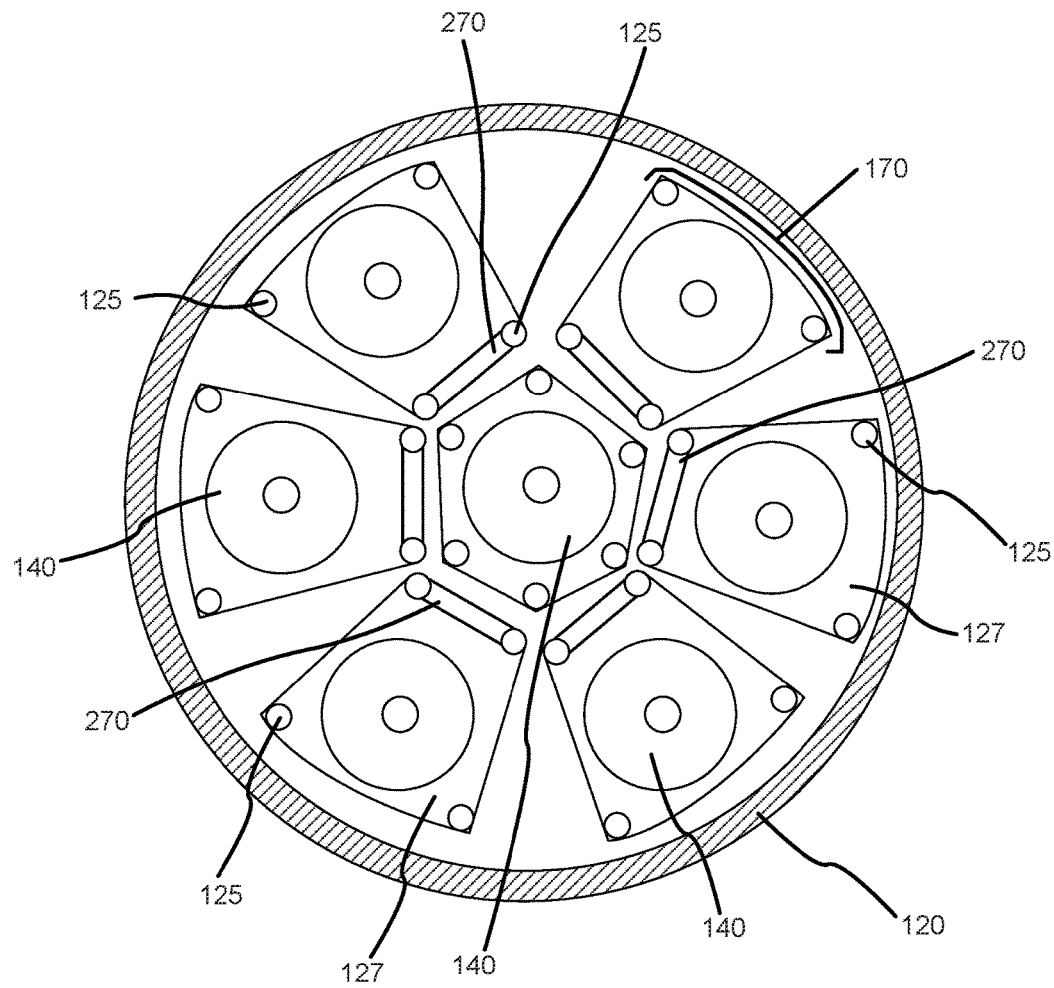
FIG. 3 illustrates a top view of a CVI/CVD furnace, in accordance with various embodiments.

In various embodiments, and with reference to FIGS. 2 and 3, at least one graphite panel 270 may be used to decrease the radial temperature gradient in porous structure stacks 140 during CVI/CVD processes. Graphite panels 270 may be disposed within hardware assembly 170, in a location radially inward from porous structure stacks 140. In this regard, graphite panels 270 may radiate heat radially outward, with regards to vessel 115, towards porous structure stacks 140 and graphite susceptor 120. By radiating heat energy towards porous structure stacks 140, the porous structures 142 may be more uniformly heated, decreasing the radial temperature gradient. A uniformly distributed temperature gradient may allow for a more uniform density in a finished porous structure 142. A uniformly distributed temperature gradient may also allow for uniform carbon microstructure and porosity in the finished porous structure 142. The reduction in temperature gradient in porous structures 142 may also lower HOG by at least 10%. Decreasing the HOG during a CVI/CVD process may decrease the amount of electricity (KW-hr) required to heat porous structure stacks 140. Moreover, the uniform temperature gradient may improve the efficiency of a CVI/CVD process and increase the likelihood of obtaining a final density in a single-cycle CVI run.

With reference to FIG. 2, graphite panel 270 may comprise a top 276 and a bottom 271. Bottom 271 may comprise an edge of graphite panel 270 that is proximate inlet openings 121 when graphite panel 270 is disposed within hardware assembly 170. Top 276 may comprise an edge of graphite panel 270 that is proximate outlet openings 126 when graphite panel 270 is disposed within hardware assembly 170. Graphite panel 270 may be removably disposed within hardware assembly 170 such that graphite panel 270 may be removed from hardware assembly 170 between CVI/CVD processes, or may be left within hardware assembly 170 between CVI/CVD processes. Removal of graphite panel 270 in that regard may also allow for easier access to porous structure stacks 140 between CVI/CVD processes, or during any other desired time. Use of graphite panel 270 in this regard may also allow for a decrease in the radial temperature gradient in porous structure stacks 140, while also limiting the amount of volumetric space taken up in furnace 110.

In various embodiments, graphite panel 270 may also comprise a plurality of voids 275. Voids 275 may be configured to allow reactant gas to pass through graphite panel 270. Graphite panel 270 may comprise any suitable number of voids 275. Voids 275 may also comprise any suitable shape and/or size capable of allowing reactant gas to pass through. Graphite panel 270 may comprise any suitable and/or desired thickness capable of radiating heat. In various embodiments, it may be desirable to select a thickness that may not cause graphite panel 270 to have a high weight, while also not selecting a thickness that may cause graphite panel 270 to be too brittle, and/or a too low radiator of heat. In this regard, graphite panel 270 may comprise a thickness from about 0.25 inches (6.5 mm) to about 0.75 inches (19.05 mm), or from about 0.75 inches (19.05 mm) to about 1.5 inches (38.1 mm) (wherein the term about in this context means only +/−0.05 inches (1.27 mm)). In various embodiments, graphite panel 270 may comprise a thickness of 0.50 inches (12.7 mm). Graphite panel 270 may comprise any suitable graphite or carbon/carbon material, and may comprise a coating to protect against CVD bonding.

With reference to FIGS. 1 and 3, graphite panel 270 may be disposed in any suitable location within hardware assembly 170. In this regard, graphite panel 270 may be disposed in a location suitable to radiate heat towards porous structure stacks 140. For example, graphite panel 270 may be inserted into hardware assembly 170 at a location radially inward, with regards to vessel 115, from porous structure stacks 140. In various embodiments, graphite support post 125 may be configured to support graphite panel 270. In this regard, a slot may be machined into graphite support post 125, at a size about the width of graphite panel 270. Graphite panel 270 may then insert into the slot of graphite support post 125, allowing graphite panel 270 to removably insert within hardware assembly 170. In various embodiments, the slot in graphite support post 125 may substantially align with a slot in a second graphite support post 125, such that graphite panel 270 may insert into two graphite support posts 125 to further support graphite panel 270 while disposed within hardware assembly 170.

In various embodiments, graphite panels 270 may be spaced within hardware assembly 170 to allow for the flow of reactant gas. For example, graphite panels 270 may be located only radially inward of porous structure stacks 140 such that reactant gas may pass between each graphite panel 270 (e.g., as depicted in FIG. 3). Graphite panels 270 may also be disposed within hardware assembly 170 such that there is a small space left between top 276 of graphite panel 270 and graphite support plates 127, allowing reactant gas to flow between graphite support plates 127 and graphite panel 270. In this regard, enabling reactant gas to pass around graphite panel 270 allows for heat transfer, convection, and radiation from graphite susceptor 120 to porous structure stacks 140 that may be in the center of furnace 110. Maintaining an adequate view factor for radiative heat transfer from graphite susceptor 120 may prevent a center porous structure stack 140 from realizing a drop in temperature that would otherwise be created if there were no space between graphite panels 270.

Figure 4:
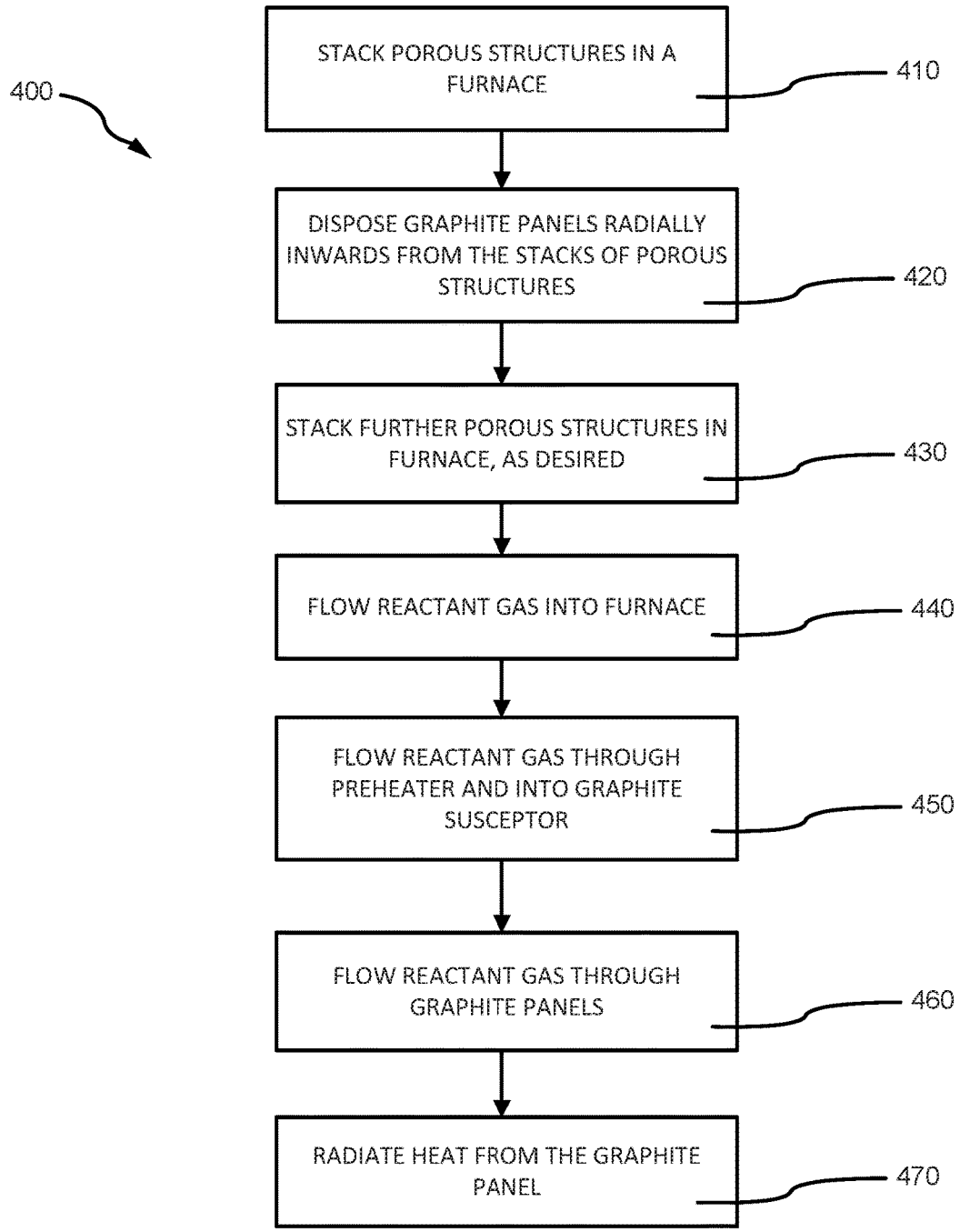
FIG. 4 illustrates a process flow for a method for decreasing the radial temperature gradient in a CVI/CVD apparatus, in accordance with various embodiments.

In various embodiments, and with reference to FIG. 4, a method 400 for densifying an annular porous structure is disclosed. Method 400 may comprise stacking porous structures 142 in a furnace (step 410). Porous structures 142 may be stacked in any suitable furnace, such as furnace 110. Furnace 110 may comprise graphite susceptor 120 disposed within furnace 110. Step 410 may comprise alternating stacking porous structures 142 with spacers 145 to form porous structure stacks 140. Porous structure stacks 140 may be disposed within hardware assembly 170. Hardware assembly 170 may then be disposed within furnace 110. Hardware assemblies 170 may be disposed in a circular formation around the interior perimeter of graphite susceptor 120. Method 400 may comprise disposing graphite panels in the furnace, radially inwards from the stacks of porous structures (step 420). Graphite panels 270 may be disposed radially inward of porous structure stacks 140, in a position to radiate heat back towards porous structure stacks 140. Graphite panels 270 may be disposed within hardware assembly 170, radially inward from porous structure stacks 140 in hardware assembly 170. Graphite panels 270 may be disposed with suitable spacing to allow the flow of reactant gas and permit radiative heat transfer from graphite susceptor 120 to an inner porous structure stack 140.

In various embodiments, method 400 may comprise further stacking annular porous structures into the furnace, as desired (step 430). Annular porous structure stacks 140 may be disposed within hardware assemblies 170, and may then be disposed within furnace 110 at a location radially inward from graphite panels 270. Hardware assemblies 170 may continue to be disposed within furnace 110 as desired, and given the volumetric space within graphite susceptor 120.

In various embodiments, method 400 may comprise flowing reactant gas into the furnace (step 440). The reactant gas may be flowed from reactant gas feed line 160, via inlet control valve 165, through inlet duct 111 and into vessel 115. In various embodiments, method 400 may comprise flowing the reactant gas through preheater 180 and into graphite susceptor 120 (step 450). Preheater 180 may heat the reactant gas to a defined temperature before the reactant gas flows through inlet opening 121, and into graphite susceptor 120. In various embodiments, method 400 may comprise flowing the reactant gas through graphite panels 270 (step 460). Step 460 may comprise the reactant gas flowing through voids 275 of graphite panels 270. In various embodiments, method 400 may comprise radiating heat from graphite panel 270 (step 470). In this regard, graphite panel 270 may radiate heat radially outwards, towards porous structure stacks 140.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosures. The scope of the disclosures is accordingly to be limited by nothing other than the appended claims and their legal equivalents, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An apparatus for densifying an annular porous structure, comprising:
   a vessel;
   a graphite susceptor disposed within the vessel, wherein the graphite susceptor is configured to receive a reactant gas flow;
   a hardware assembly disposed within the graphite susceptor, wherein the hardware assembly comprises a plurality of outer graphite support posts and a plurality of inner graphite support posts configured to provide structural support to the hardware assembly;
   a porous structure stack disposed within the hardware assembly, the porous structure stack comprising the annular porous structure, and wherein the hardware assembly is sized and shaped to contain a single porous structure stack, wherein the plurality of inner graphite support posts are distributed circumferentially about the porous structure stack; and
   a graphite panel comprising a planar structure extending axially parallel and radially tangential to the porous structure stack, removably coupled to the inner graphite support posts radially inward from the porous structure stack, wherein the graphite panel is configured to radiate heat in a radial direction towards the porous structure stack and the graphite susceptor to decrease a radial temperature gradient in the porous structure stack, wherein each inner graphite support post comprises a slot sized and shaped to receive the graphite panel, wherein the graphite panel is removably coupled to the inner graphite support posts by being inserted within the slot, and wherein the graphite panel comprises a void configured to allow passage of the reactant gas flow.

2. The apparatus of claim 1, wherein the graphite panel is 0.50 inches thick.

3. The apparatus of claim 1, further comprising a preheater, wherein the preheater is configured to heat the reactant gas flow to a defined temperature before flowing into the graphite susceptor.

4. The apparatus of claim 1, wherein the annular porous structure comprises a carbon fiber.

5. The apparatus of claim 1, wherein the graphite panel is removably coupled to the inner graphite support posts to allow passage of the reactant gas flow between the graphite panel and the hardware assembly.

6. The apparatus of claim 5, further comprising a second porous structure stack disposed radially inward from the graphite panel, wherein the graphite panel is removably coupled to the inner graphite support posts to maintain an adequate view factor for radiative heat transfer from the graphite susceptor to the second porous structure stack.

7. An apparatus for densifying an annular porous structure, comprising:
a vessel;
a graphite susceptor disposed within the vessel and configured to radiate heat energy radially inward from the vessel, wherein the graphite susceptor is configured to receive a reactant gas;
a hardware assembly disposed within the graphite susceptor, comprising a graphite support plate coupled to a plurality of graphite support posts distributed circumferentially about a center axis of the vessel, wherein the plurality of graphite support posts comprises a first outer support post, a second outer support post, a first inner support post, and a second inner support post, wherein the first outer support post and the second outer support post are proximate the vessel and the first inner support post and the second inner support post are radially inward from the first outer support post and the second outer support post in response to the hardware assembly being disposed within the graphite susceptor; and
a graphite panel, comprising a planar structure extending axially parallel and tangent to the center axis of the vessel, removably coupled to the first inner support post and the second inner support post, wherein the graphite panel is configured to radiate heat radially outward towards the vessel, wherein the first inner support post and the second inner support post each comprise a slot sized and shaped to receive the graphite panel, wherein the graphite panel is removably coupled to the first inner support post and the second inner support post by being inserted within the slot of each graphite support post, and wherein the graphite panel comprises at least one void configured to allow passage of the reactant gas.

8. The apparatus of claim 7, wherein the graphite panel is 0.50 inches thick.

9. The apparatus of claim 7, further comprising a preheater, wherein the preheater is configured to heat the reactant gas to a defined temperature before flowing into the graphite susceptor.

10. The apparatus of claim 7, wherein the reactant gas comprises at least one of methane, ethane, propane, cyclopentane, hydrogen, nitrogen, helium, argon, or an alkane.

11. The apparatus of claim 7, further comprising a porous structure stack disposed within the hardware assembly and located radially outward from the graphite panel, wherein the porous structure stack comprises the annular porous structure.

12. The apparatus of claim 7, wherein the graphite panel is removably coupled to the first inner support post and the second inner support post to allow passage of the reactant gas flow between the graphite panel and the graphite support plate.

13. The apparatus of claim 12, further comprising a second porous structure stack disposed radially inward from the graphite panel, wherein the graphite panel is removably coupled to the first inner support post and the second inner support post to maintain an adequate view factor for radiative heat transfer from the graphite susceptor to the second porous structure stack.

* * * * *